United States Patent
Torii et al.

(10) Patent No.: US 9,841,673 B2
(45) Date of Patent: Dec. 12, 2017

(54) IMPRINT APPARATUS AND ARTICLE MANUFACTURING METHOD

(75) Inventors: Hirotoshi Torii, Utsunomiya (JP); Yusuke Tanaka, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 753 days.

(21) Appl. No.: 14/127,213

(22) PCT Filed: Aug. 8, 2012

(86) PCT No.: PCT/JP2012/005052
§ 371 (c)(1),
(2), (4) Date: Dec. 18, 2013

(87) PCT Pub. No.: WO2013/021641
PCT Pub. Date: Feb. 14, 2013

(65) Prior Publication Data
US 2014/0138875 A1    May 22, 2014

(30) Foreign Application Priority Data
Aug. 11, 2011  (JP) ................. 2011-175722

(51) Int. Cl.
*B29C 59/00* (2006.01)
*G03F 7/00* (2006.01)
(Continued)

(52) U.S. Cl.
CPC ............ *G03F 7/0002* (2013.01); *B29C 59/02* (2013.01); *B82Y 10/00* (2013.01); *B82Y 40/00* (2013.01)

(58) Field of Classification Search
CPC ..................................................... G03F 7/0002
See application file for complete search history.

(56) References Cited

U.S. PATENT DOCUMENTS

2005/0006343 A1   1/2005   Choi et al.
2006/0192928 A1   8/2006   Kasumi et al.
(Continued)

FOREIGN PATENT DOCUMENTS

JP       8-207159 A     8/1996
JP    2006-245071 A     9/2006
(Continued)

OTHER PUBLICATIONS

International Search Report dated Nov. 9, 2012 in PCT/JP2012/005052.
(Continued)

*Primary Examiner* — Timothy Kennedy
(74) *Attorney, Agent, or Firm* — Rossi, Kimms & McDowell LLP

(57) ABSTRACT

An imprint apparatus molds and cures an imprint material on a substrate using a mold to thereby form a pattern on the substrate. The apparatus includes a first drive mechanism configured to apply a force in a planar direction of the mold and change the planar shape of the pattern portion formed in the mold, and a second drive mechanism configured to deform the mold about an axis (for example, the Y axis) that is orthogonal to the pressing direction of the mold and the uncured resin (for example, the Z axis) and a direction of the force applied by the first drive mechanism (for example, the X axis).

10 Claims, 5 Drawing Sheets

(51) Int. Cl.
B29C 59/02 (2006.01)
B82Y 10/00 (2011.01)
B82Y 40/00 (2011.01)

(56) References Cited

U.S. PATENT DOCUMENTS

2009/0108484 A1* 4/2009 Kruijt-Stegeman .. G03F 7/0002
264/40.5
2010/0297282 A1* 11/2010 De Schiffart ......... G03F 7/0002
425/385

FOREIGN PATENT DOCUMENTS

JP 2007-535121 A 11/2007
JP 2010-80714 A 4/2010

OTHER PUBLICATIONS

International Search Report dated Sep. 11, 2012 in PCT/JP2012/005052.

* cited by examiner

[Fig. 1]
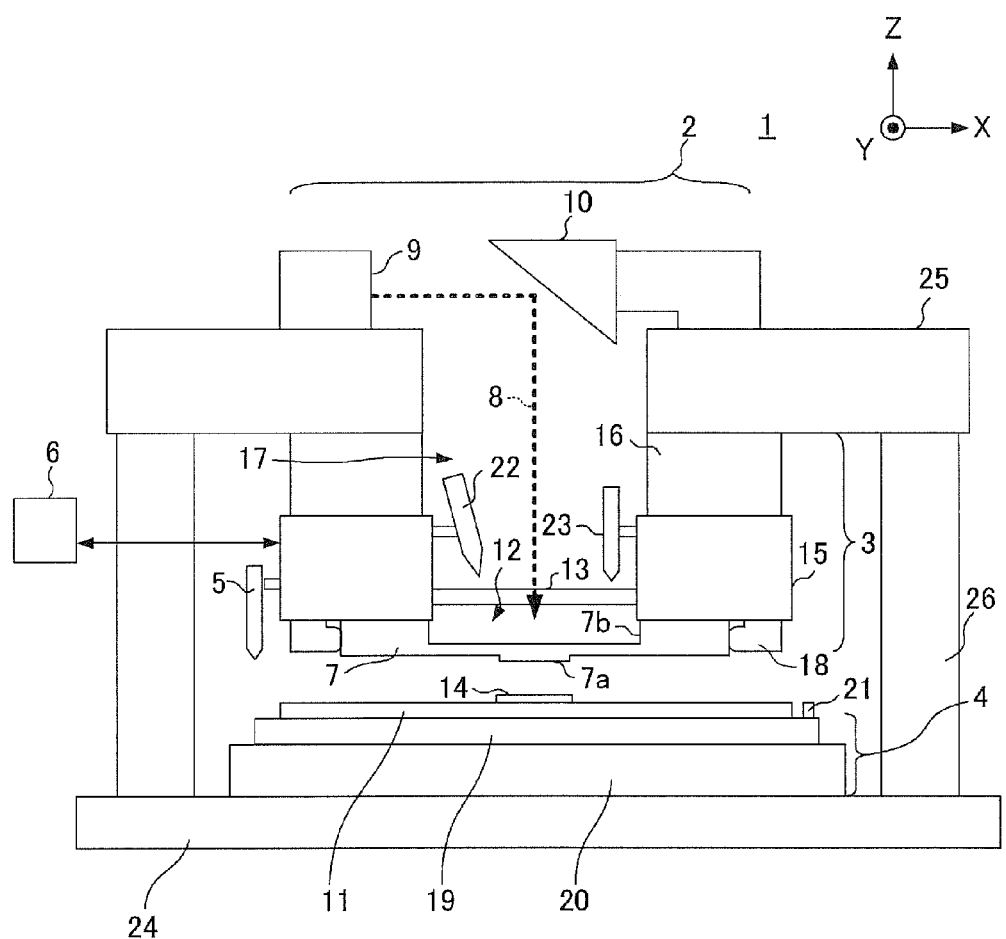

[Fig. 2A]
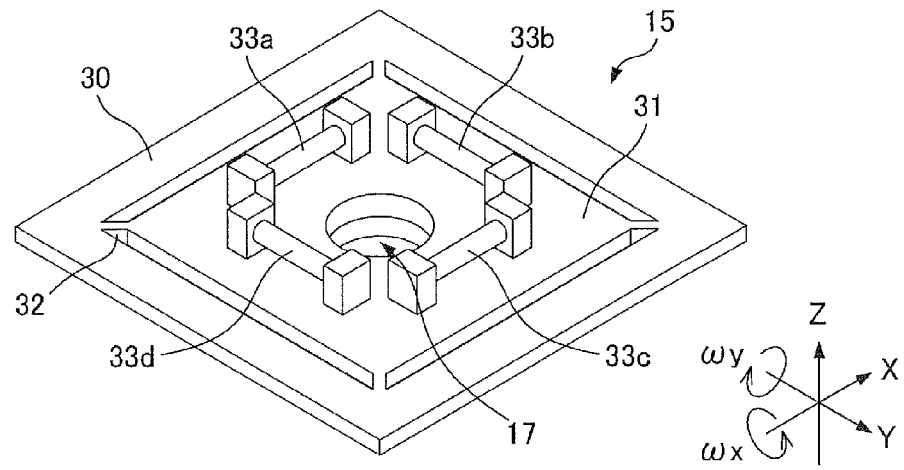
[Fig. 2B]
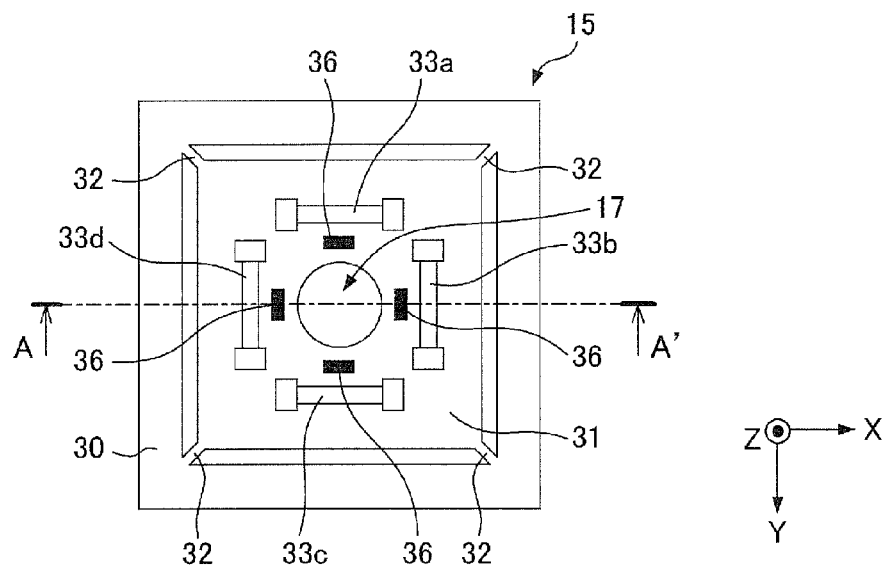
[Fig. 2C]
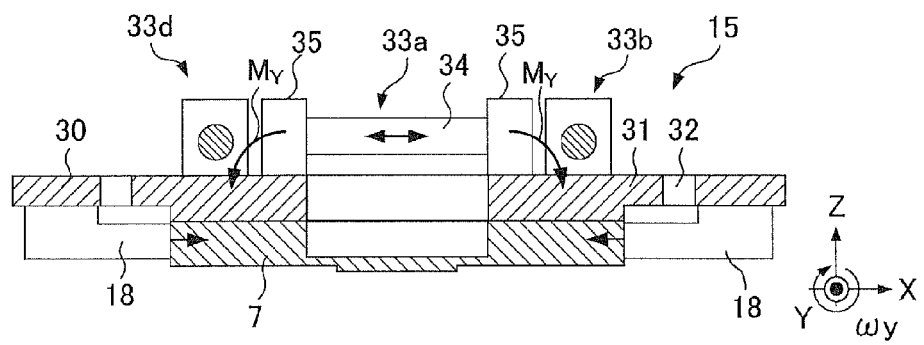

[Fig. 3]
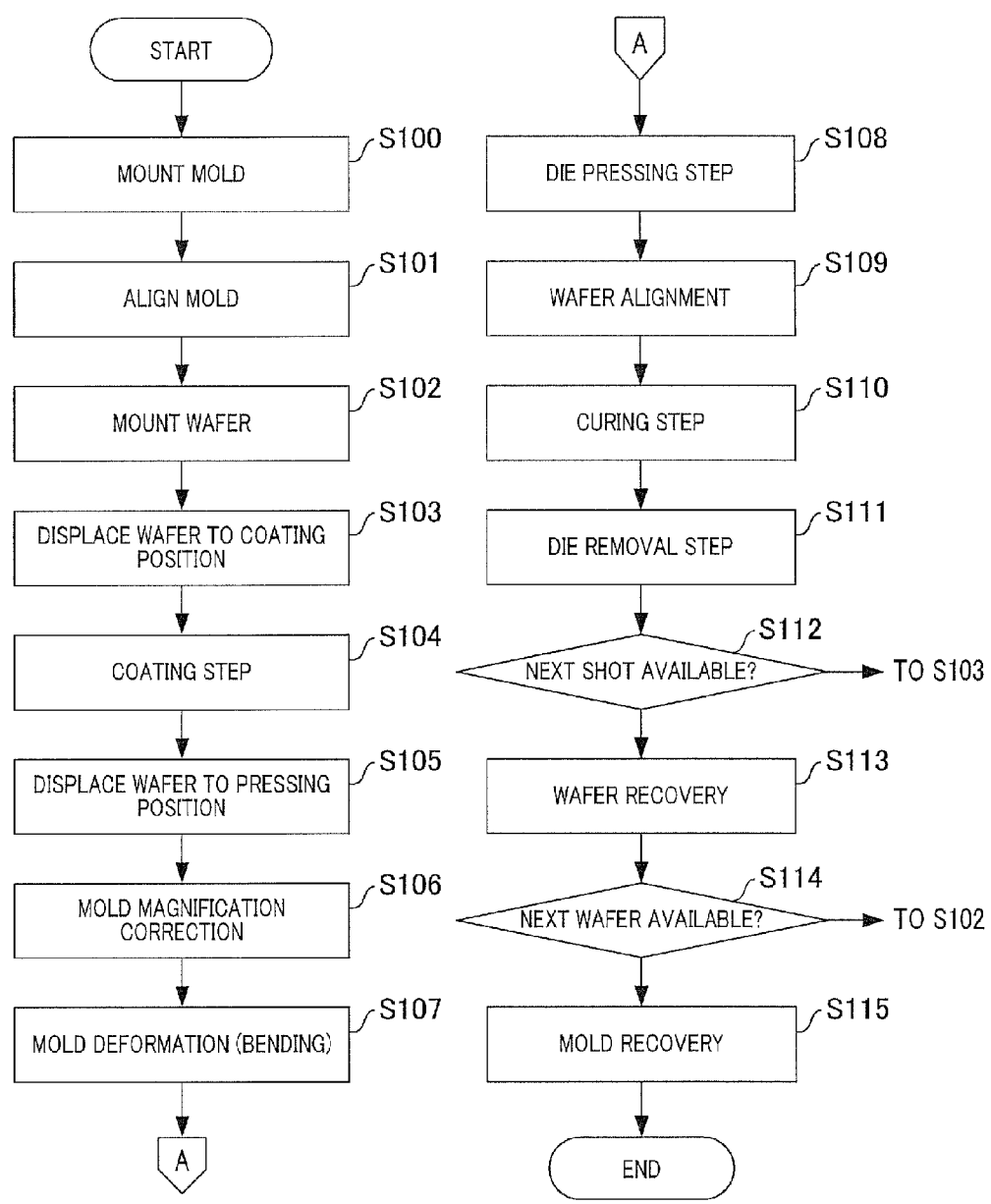

[Fig. 4A]
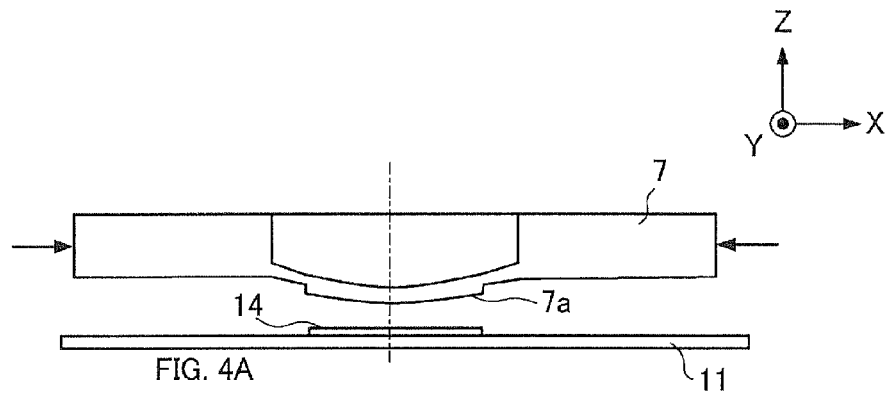
FIG. 4A
[Fig. 4B]
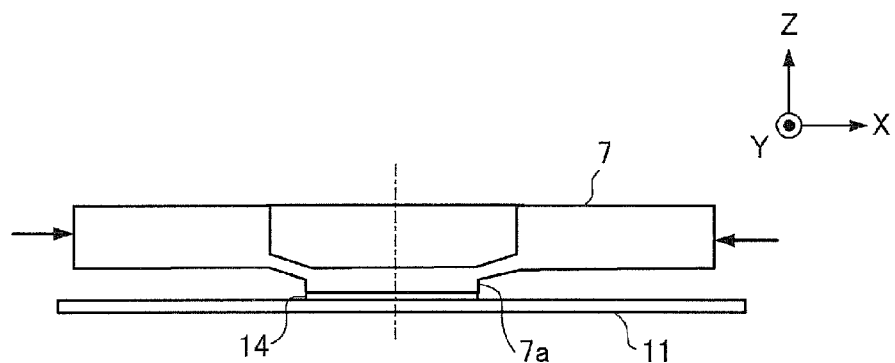
[Fig. 4C]
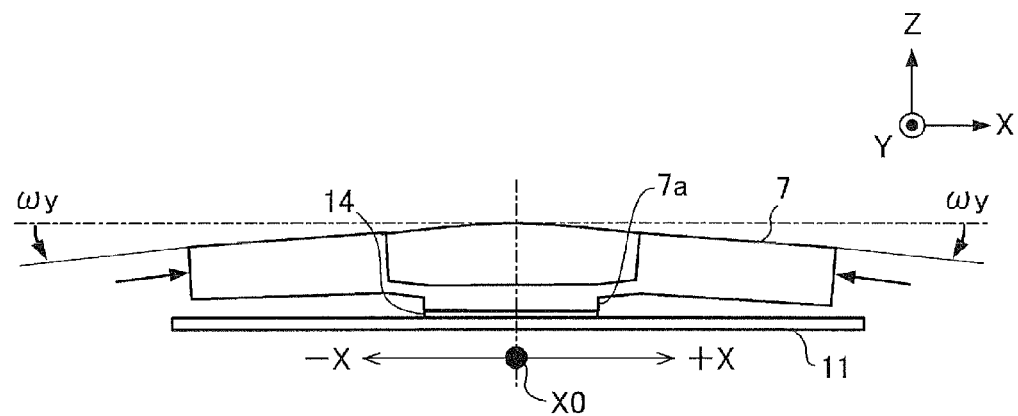

[Fig. 5A]
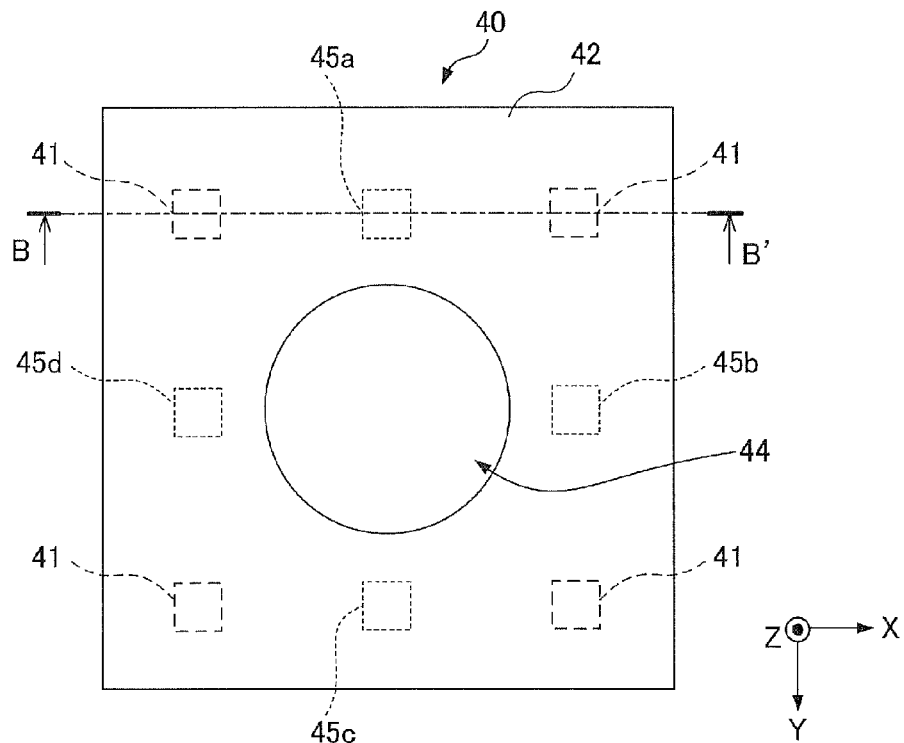
[Fig. 5B]
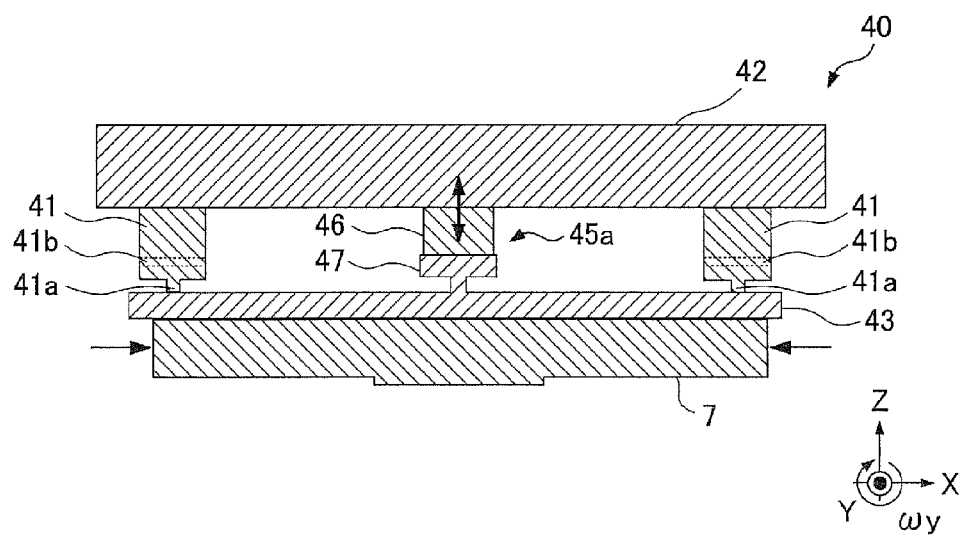

IMPRINT APPARATUS AND ARTICLE MANUFACTURING METHOD

TECHNICAL FIELD

The present invention relates to an imprint apparatus and an article manufacturing method.

BACKGROUND ART

As the demand for microfabrication of semiconductor devices and MEMS increases, not only a conventional photolithography technology but also a microfabrication technology in which an uncured resin on a substrate is molded by a mold to thereby form a resin pattern on the substrate have been receiving attention. This technology is also referred to as an "imprint technology", by which a fine structure with dimensions of a few nanometers can be formed on a substrate. One example of imprint technologies includes a photo-curing method. An imprint apparatus employing the photo-curing method first applies an ultraviolet curable resin (imprint resin, photocurable resin) to a shot area (imprint area) on a substrate (wafer). Next, the resin (uncured resin) is molded by a mold. After the ultraviolet curable resin is irradiated with ultraviolet light for curing, the cured resin is released from the mold, whereby a resin pattern is formed on the substrate.

Here, the substrate used in the imprint process may undergo an overall expansion or contraction resulting in a change in the magnification (size) of the pattern in a biaxial direction that is orthogonal to the surface due to a heating process in a film formation step such as sputtering or the like during the series of device manufacturing steps. Therefore, when an imprint apparatus presses the mold and the resin on the substrate, the pattern magnification formed on the substrate must coincide with the magnification of the pattern portion formed in the mold. When this type of magnification correction is performed using a conventional exposure apparatus, the respective shot sizes during exposure processing are changed by changing the demagnification in the projection optical system in response to the magnification of the substrate, and the scanning speed of the substrate stage. However, an imprint apparatus does not include a projection optical system, and the above type of magnification correction cannot be executed since the resin on the substrate and the mold come into direct contact. In this regard, an imprint apparatus adopts a magnification correction mechanism in which an external force is applied from the side of the mold or the mold is heated to thereby produce an expansion and physically deform the mold.

For example, it is assumed that the above imprint apparatus is applied to the manufacturing process for a semiconductor device having a 32 nm halfpitch. According to the International Technology Roadmap for Semiconductors (ITRS), the overlay accuracy is 6.4 nm. Therefore, to comply with this feature, the magnification correction must also be executed at an accuracy of no more than several nm. On the other hand, a mold (pattern portion) used in the imprint device may also produce a distortion for the following reasons. For example, although the pattern surface of the mold may exhibit an upward incline during preparation, the pattern surface may exhibit a downward incline during use (during pressing). Therefore, there is a possibility of a deformation to the pattern portion due to the effect of gravity or the like during use. Furthermore, the pattern portion is generally formed by a drawing apparatus using an electron beam or the like. During formation, there is the possibility of a distortion due to a distortion aberration in the optical system of the drawing apparatus. Furthermore, even if the pattern portion is prepared without an aberration, if an aberration is produced in the pattern that is preformed on the substrate, the overlay accuracy will be affected. In this regard, as an example of a configuration that inhibits distortion (deformation) in this type of mold, Japanese Patent Laid-Open No. 2010-80714 discloses a stamping apparatus that includes a holding unit configured to hold a plurality of peripheral portions of a mold on a mold chuck and a drive mechanism for positional determination of the holding unit in a Z axis direction with reference to the substrate. This stamping apparatus improves the overlay accuracy by correcting so that the shape of the mold coincides with the shape of the substrate.

CITATION LIST

Patent Literature

[PTL 1]
Patent Document 1: Japanese Patent Laid-Open No. 2010-80714

However, in a conventional imprint apparatus, when the magnification correction mechanism deforms the mold during pressing operations, the pattern portion (pattern area) formed in the mold deforms in the pressing direction, and the amount of deformation changes in response to the correction amount applied by the magnification correction mechanism. Therefore, when the mold (pattern portion) is pressed in this configuration onto the resin on the substrate, the mold deforms in a configuration in which stress is concentrated on a part of the pattern portion, in particular, the outermost peripheral portion, the linearity of the pattern pitch is disrupted and thereby affects the overlay accuracy. Furthermore, when correcting a magnification that is different in the biaxial direction on the XY plane, the distortion or stress produced in the pattern portion also differs in both the X axis and Y axis directions. In this regard, concentration of stress produced in the pattern portion (including stress concentration respectively in the X and Y axis directions) may be inhibited. However, the stamping apparatus illustrated in Japanese Patent Laid-Open No. 2010-80714 does not have a sufficient inhibiting effect on stress concentration since the holding units at four positions are only merely driven in the Z axis direction.

SUMMARY OF INVENTION

Therefore, the present invention provides, for example, an imprint apparatus that is useful for improving the overlay accuracy between a mold and resin on a substrate.

In an aspect of the present invention, an imprint apparatus molds and cures an imprint material on a substrate using a mold to thereby form a pattern on the substrate. The apparatus includes a first drive mechanism configured to apply a force in a planar direction of the mold and change the planar shape of the pattern portion formed in the mold and a second drive mechanism configured to deform the mold about an axis that is orthogonal to the pressing direction of the mold and the uncured resin and a direction of the force applied by the first drive mechanism.

According to the present invention, for example, it is possible to provide an imprint apparatus that is useful for improving the overlay accuracy between a mold and resin on a substrate.

Further features of the present invention will become apparent from the following description of embodiments with reference to the attached drawings.

BRIEF DESCRIPTION OF DRAWINGS

FIG. 1 is a diagram illustrating the configuration of an imprint apparatus according to a first embodiment of the present invention.

FIG. 2A is a diagram illustrating a mold chuck according to the first embodiment.

FIG. 2B is a sectional view from the direction of irradiation with UV light of the mold chuck according to the first embodiment.

FIG. 2C is a sectional view along the line A-A' of the mold chuck according to the first embodiment.

FIG. 3 is a flowchart illustrating the operational sequence during an imprint process.

FIG. 4A illustrates the shape of the mold prior to a pressing operation.

FIG. 4B illustrates the shape of the mold during a pressing operation.

FIG. 4C illustrates the shape of the mold after a pressing operation.

FIG. 5A is a diagram illustrating a mold chuck according to a second embodiment.

FIG. 5B is a perspective view along the line B-B' of a mold chuck according to the second embodiment.

DESCRIPTION OF EMBODIMENTS

First Embodiment

Firstly, a description will be given of the configuration of an imprint apparatus according to a first embodiment of the present invention. FIG. 1 illustrates the configuration of an imprint apparatus. The imprint apparatus according to this embodiment is used in the manufacture of an article such as a device including a semiconductor device or the like, and molds uncured resin on a wafer (on a substrate) that is the processed substrate with a mold to thereby form a resin pattern on the wafer. The imprint apparatus used herein employs a photocuring method. Furthermore, in the figures below, the Z axis is taken to be parallel to the optical axis of the irradiation system that irradiates UV light onto the resin on the wafer, and the X axis and the Y axis are taken to be mutually orthogonal in a plane that is perpendicular to the Z axis. The imprint apparatus 1 basically includes a light irradiation unit 2, a mold holding mechanism 3, a wafer stage 4, a dispenser 5 and a controller 6.

The light irradiation unit 2 irradiates UV light 8 onto the mold 7 during imprint processing. The light irradiation unit 2 includes a light source 9 and an optical element 10 configured to adjust the UV light 8 emitted from the light source 9 to light that is suitable for imprinting. In the present embodiment, although the light irradiation unit 2 is installed for use of a photocuring method, when for example, a thermocuring method is used, a heat source unit for curing a thermocurable resin is provided in substitution for the light irradiation unit 2.

The outer peripheral shape of the mold 7 is rectangular and the mold 7 includes a pattern portion (for example, an undulating pattern for transfer of a circuit pattern or the like) 7a formed in a three dimensional configuration on the surface facing a wafer 11. The material used in the mold 7 is a material that enables transmission of UV light 8 such as quartz or the like. The mold 7 may be configured with a shape that includes a cavity (indentation) 7b for facilitating the deformation of the mold 7 on the surface irradiated by UV light 8. The cavity 7b has a circular planar shape, and the thickness (depth) is suitably set in response to the size or the material of the mold 7. A configuration is also possible in which a light transmission member 13 is provided in the open region 17 in the mold holding mechanism 3 as described hereafter, and configures a space 12 enclosed by a part of the open region 17 and the cavity 7b as a closed space, and thereby pressure in the space 12 is controlled by a pressure adjustment apparatus (not illustrated). For example, when pressing the mold 7 and the resin 14 on the wafer 11, the pattern portion 7a (pattern area) bends into a protruding shape towards the wafer 11 and comes into contact with the resin 14 from the center part of the pattern portion 7a due to the pressure in the space 12 being set by the pressure adjusting apparatus to a higher value than the external portion. In this manner, a configuration in which a gaseous body (air) is trapped between the pattern portion 7a and the resin 14 can be suppressed, and it is possible for the resin 14 to entirely fill the undulating part of the pattern portion 7a.

The mold holding mechanism 3 basically includes a mold chuck 15 that pulls and holds the mold 7 using a vacuum suction force or an electrostatic force, and a mold drive mechanism 16 that displaces the mold 7 (mold chuck 15). The mold chuck 15 and the mold drive mechanism 16 include an open region 17 in a central portion (inner side) so that UV light 8 emitted from the light source 9 of the light irradiation unit 2 is irradiated towards the wafer 11. Furthermore, the mold holding mechanism 3 includes a magnification correction mechanism (first drive mechanism) 18 for correcting the shape of the mold 7 (pattern portion 7a) by application of a force or a displacement to the side wall of the mold 7 on the side on which the mold 7 is held in the mold chuck 15. The magnification correction mechanism 18 matches the magnification of the pattern portion 7a formed in the mold 7 to the magnification of the pattern preformed on the wafer 11 by deforming the shape of the mold 7.

FIGS. 2A, 2B, and 2C are schematic views illustrating the configuration of the mold chuck (mold holding unit) according to the present embodiment. In particular, FIG. 2A is a perspective view of the mold chuck 15. FIG. 2B is a sectional view seen from the direction of irradiation with UV light 8. FIG. 2C is a sectional view along the line A-A' that corresponding to A-A' in FIG. 2B. The mold chuck 15 is a tabular member that has a surface area that is larger than the mold 7, and has a rectangular outer peripheral shape. Furthermore, the mold chuck 15 includes a base portion 30 that is positioned in an outer peripheral portion, and in which the surface on the side irradiated with UV light 8 is in contact with the mold drive mechanism 16, and a holding portion 31 that is positioned on an inner side of the base portion 30, has a rectangular outer peripheral shape and holds the mold 7 on the surface facing the wafer 11. The base portion 30 and the holding portion 31 are connected by four connecting portions 32. The connecting portions 32 are configured from flexible plate springs configured so that the holding portion 31 can deform in response to a relatively small force, and for example, as illustrated in FIG. 2A and FIG. 2B, are disposed respectively in the four corners on the diagonal lines of the holding portion 31. There is no particular limit on the position of installation of the connecting portion 32, however it is desirable that installation is positioned in relation to the direction of deformation of the holding portion 31. The term "flexible" means having a low thickness and pliability in which bending is facilitated in a desired direction.

The holding portion 31 forms an open region 17 in the central portion of the XY plane, and although not illustrated, includes a suction portion that draws the outer edge (outer peripheral surface) of the mold 7 that is positioned on the outer periphery of the open region 17 on the surface facing the wafer 11. The suction portion is connected for example to a vacuum exhaust apparatus (not shown) installed in an external position, and the suction pressure is adjusted by the vacuum exhaust apparatus to thereby switch the suction ON/OFF. The holding portion 31 includes a second drive mechanism configured as four actuators (33a-33d) to produce a bending moment M in the mold 7. As illustrated in FIG. 2A and FIG. 2B, the actuators 33 are disposed along the side on the outer periphery of the respective holding portions 31 and on the periphery of the open region 17. Furthermore, when viewing the actuator 33a that is disposed on the Y axis direction illustrated in FIG. 2C as an example, the length of the main body of the actuators 33 is substantially the same as the diameter of the open region 17, and includes a drive unit 34 in which the driving direction (stroke direction) coincides with the planar direction of the mold chuck 15. The drive unit 34 may be configured by a piezo actuator, linear motor, or an air cylinder. The drive unit 34 is supported at both ends respectively on a fixing member 35, and is fixed to the mold chuck 15 by the fixing member 35. The other actuators 33b-33c respectively have the same configuration as the actuator 33a. This actuator 33 enables separate generation of a bending in the omega y direction about the Y axis and the omega x direction about the X axis. For example, when driving one or both of the actuator 33a and the actuator 33c that are disposed in the Y axis direction, as illustrated in FIG. 2C, a rotational moment $M_Y$ about the Y axis acts on the holding portion 31 and the mold 7 deforms along the direction of the rotational moment $M_Y$. In the same manner, when driving one or both of the actuator 33b and the actuator 33d that are disposed in the X axis direction, a rotational moment $M_X$ about the X axis acts on the holding portion 31 and the mold 7 deforms along the direction of the rotational moment $M_X$. In this manner, the configuration of a plurality of actuators 33 in the X axis and Y axis directions is particularly effective when adopting an actuator having a long stroke, and thereby enables high-accuracy oscillating driving in the Z axis direction with a relatively small developed force. Furthermore, the holding portion 31 includes provision of a distortion sensor (measuring device) configured to measure distortion (bending distortion: deformation amount) of the holding portion 31 itself. The distortion sensor 36 in the present embodiment as illustrated in FIG. 2B measures the distortion of the face (chuck face) corresponding to the installation position of the respective actuators 33. In substitution for a distortion sensor 36, for example, a configuration is possible in which a position sensor is provided at a portion of the base portion 30 to thereby measure the displacement in the Z axis direction of the mold chuck 15 or the mold 7. When this type of position sensor is used, installation is preferred in a position enabling measurement of a location of respectively large displacement on the X axis and Y axis.

The mold drive mechanism (mold drive mechanism) 16 displaces the mold 7 in the Z axis direction to selectively press and separate the mold 7 and the resin 14 on the wafer 11. A linear motor or air cylinder is example of an actuator capable of application to the mold drive mechanism 16. Furthermore, a configuration from a plurality of driving elements such as a coarse driving system and a fine driving system may be used to adapt to highly accurate positional determination of the mold 7. A configuration is also possible that includes a positional adjustment function in the X axis direction, Y axis direction, or the theta (rotation about the Z axis) direction in addition to only the Z axis direction, or a tilting function for correction of inclination in the mold 7. The operation of pressing and separating in the imprint apparatus 1 may be realized by displacement of the mold 7 in the Z axis direction as described above. However, it may be realized by displacement of the wafer stage 4 in the Z axis direction or by relative displacement of both those components.

The wafer 11 for example is a monocrystalline silicon substrate or a silicon on insulator (SOI) substrate in which the processed surface is coated with a UV curing resin (hereinafter "resin") 14 that is formed by the pattern portion 7a provided on the mold 7.

The wafer stage (substrate holding unit) 4 holds the wafer 11, and enables positional alignment of the mold 7 and the resin 14 when the mold 7 and the resin 14 on the wafer 11 are pressed. This wafer stage 4 includes a wafer chuck 19 that holds the wafer 11 for example by vacuum suction and a stage drive mechanism 20 that holds the wafer chuck 19 using a mechanical means and that can displace in the XY plane. The wafer chuck 19 includes a reference mark 21 used when aligning the mold 7. An actuator that can be used in relation to the stage drive mechanism 20 includes a linear motor for example. The stage drive mechanism 20 may also be configured from a plurality of driving elements such as a coarse driving system and a fine driving system in relation to the respective X axis and Y axis directions. Furthermore, a configuration is also possible that includes a driving system for positional adjustment in the Z axis direction, a positional adjustment function in the theta direction of the wafer 11, or a tilting function for correction of inclination in the wafer 11.

The dispenser 5 applies a resin (uncured resin) 14 to the wafer 11. The resin 14 is a photocurable resin (imprint material) that is cured by incident UV light 8, and may be suitably selected in response to various conditions such as semiconductor device manufacturing processes. The amount of resin 14 extruded from the extrusion nozzle of the dispenser 5 is also suitably adjusted in response to the desired thickness of the resin 14 formed on the wafer 11, the density of the resulting pattern, or the like.

The controller 6 controls the operation and adjustment of each constituent element in the imprint apparatus 1. The controller 6 for example is configured by a computer, and is connected with each constituent element in the imprint apparatus 1 by a circuit to thereby control each constituent element according to a program or the like. The controller 6 in the present embodiment at least controls the operation of the mold holding mechanism 3 (mold chuck 15). The controller 6 may be configured by integration with the other portions of the imprint apparatus 1 (in a common housing), or may be configured separately to the other portions of the imprint apparatus 1 (in a separate housing).

The imprint apparatus 1 is provided with an alignment measuring system 22 and a distance measuring system 23 configured to measure the distance between the mold 7 and the wafer 11. The alignment measuring system 22 for example measures the wafer alignment as the positional deviation in the respective X axis and Y axis directions with respect to the alignment mark formed on the mold 7 and the alignment mark formed on the wafer 11. The distance measuring system 23 measures the distance by using an imaging element to observe the interference caused by light irradiated from the measuring light source passing in order through the wafer 11, mold 7 and then again the wafer 11. The imprint apparatus 1 includes a base support member 24 configured to mount the wafer stage 4, a bridge support member 25 configured to fix the mold holding mechanism 3, and a support rod 26 configured to support the bridge support member 25. Although this is not illustrated, the imprint apparatus 1 is provided with a mold conveying mechanism configured to convey the mold 7 from outside the apparatus to the mold holding mechanism 3 and a substrate conveying mechanism configured to convey the wafer 11 from outside the apparatus to the wafer stage 4.

Next, the operation of the imprint apparatus 1 will be described. FIG. 3 is a flowchart illustrating the operational sequence during an imprint process configured to use the imprint apparatus 1 to form a pattern having undulating layers on a wafer 11 in relation to a plurality of wafers 11. A single lot including the plurality of wafers 11 uses the same mold 7. Firstly, the controller 6 initiates the operational sequence and uses the mold conveying mechanism to convey and mount the mold 7 in relation to the mold chuck 15 (step S100). Next, the controller 6 uses the alignment measurement system 22 to measure the deviation in each of the X axis, Y axis and theta directions between the reference mark 21 and the alignment mark formed on the mold 7 (step S101). The controller 6 executes mold alignment by positional alignment of the reference mark 21 and the alignment mark formed on the mold 7 using the measurement result. Next, the controller 6 uses the substrate conveying mechanism to convey and mount the wafer 11 in relation to the wafer chuck 19 (step S102). Next, the controller 6 displaces the wafer 11 by use of the stage drive mechanism 20 so that the shot (processed region) of the wafer 11 is positioned on a position for applying by the dispenser 5 (step S103). Next, the controller 6 uses the dispenser 5 to apply a resin (uncured resin) 14 on the shot of the wafer 11 (applying step: step S104). Next, the controller 6 uses the stage drive mechanism 20 to displace the wafer 11 so that the shot of the wafer 11 is positioned at the pressing position immediately under the pattern portion 7a formed on the mold 7 (step S105). Next, the controller 6 uses the magnification correction mechanism 18 to correct the pattern magnification of the mold 7 (step S106). Then, the controller 6 applies a deformation (bending) to the mold 7 by adjusting the pressure in the space 12 by use of the pressure adjustment apparatus (step S107). The controller 6 uses the mold drive mechanism 16 with the mold 7 in a deformed configuration to press the mold 7 (pattern portion 7a) onto the resin 14 in the wafer 11 (extrusion process: step S108). Deformation of the mold 7 before processing in step S108 will be described below.

FIGS. 4A, 4B, and 4C illustrate the shape of the mold 7 when the mold 7 is pressed onto the resin 14 on the wafer 11. Firstly, FIG. 4A shows the configuration before pressing of the mold 7 onto the resin 14. At this time, the pattern portion 7a formed on the mold 7 is deformed by the force (compressive force) applied by the magnification correction mechanism 18 on the external peripheral portion of the mold 7 or by gravity. Then, FIG. 4B illustrates the pressing of the mold 7 onto the resin 14 while maintaining the configuration illustrated in FIG. 4A. The shape of the pattern portion 7a at the position of contact with the resin 14 is planar corresponding to the planar shape of the wafer 11, and the position not in contact with the resin 14 (including the peripheral portion of the pattern portion 7a) continues to have an expanded configuration. Therefore in this configuration, stress is concentrated in proximity to the interface of each portion, that is to say, on the outermost peripheral portion of the pattern portion 7a. Therefore, linearity in the pattern pitch is disrupted, and there is the possibility of an effect on the overlay accuracy. In this context, in the present embodiment, the deformation is applied to the mold 7 as illustrated in FIG. 4C by the actuator 33 installed on the mold chuck 15, and in this configuration, executes the extrusion step in step S108, and thereafter the curing step.

In the step of applying a deformation to the mold 7, the controller 6 as described above deforms the holding portion 31 by respective rotational moments $M_X$, $M_Y$ about the X axis and Y axis produced in relation to the holding portion 31 by driving each of the actuators 33. The mold 7 is deformed in the same manner corresponding to the deformation of the holding portion 31 due to suction onto the chuck surface of the holding portion 31. The shape of the mold 7 at this time for example includes the configuration illustrated in FIGS. 2A, 2B, and 2C, and as shown in FIG. 4C, a bending is generated in the omega y direction towards the wafer 11 with reference to the pattern center X0 due to the operation of the actuator 33a and the actuator 33c for use in the Y axis direction. The controller 6 determines the target bending amount based on the deviation amount of each alignment mark of the mold 7 and the wafer 11 obtained from the alignment measurement system 22, that is to say, the relative displacement of the pattern portion 7a and the pattern preformed on the wafer 11. Furthermore, the controller 6 may determine the bending amount based on the deformation amount of the pattern portion 7a by use of the magnification correction mechanism 18. Then, the controller 6 is configured to control the driving amount of the actuator 33a and the actuator 33c so that the measurement value (deformation amount) obtained from the distortion sensor 36 installed in the holding portion 31 takes a desired bending amount. In this manner, the imprint apparatus 1 enables suppression of concentration of stress produced on a portion of the pattern portion 7a, in particular produced on the outermost peripheral portion during the extrusion step and the curing step. Although FIG. 4C illustrates a bending in the omega y direction in relation to the mold 7, the same configuration applies to the omega x direction.

In FIG. 4C, the mold 7 has the deformation shape due to symmetrical bending with reference to the pattern center X0. In contrast, for example, it is possible to execute the pressing operation onto the shot in proximity to the edge portion of the wafer 11, or to deform the mold 7 so that the shape is asymmetrical as a result of a distortion in the mold 7 or the wafer 11. For example, when only the half of the region in the +X direction is used and pressed from the pattern center X0 of the pattern portion 7a illustrated in FIG. 4C, the center axis (reference axis) when bending the mold 7 in the omega y direction may be shifted in the +X direction. In this manner, as described above, concentration of stress produced in proximity to the interface of the contacting portions can be suppressed. FIG. 4C illustrates an example in which the magnification correction mechanism 18 in step S106 applies a compressive force to the side face of the mold 7, and therefore the deformation shape of the pattern portion 7a protrudes towards the wafer 11. In this respect, the magnification correction mechanism 18 is not limited to this type of compressive force, and may apply a tensile force. In this case, the deformation shape of the pattern portion 7a is indented towards the wafer 11, and as a result, the omega x and omega y directions that apply a bending to the mold are reversed.

Although the steps S106 and S107 in the operation sequence illustrated in FIG. 3 are executed before the extrusion step in step S108, those steps may be executed after the step S108 or during the operation of the step S108.

After step S108, the controller 6 then adjusts the position of the stage drive mechanism 20 to minimize the relative position of the alignment mark on the wafer 11 and the alignment mark formed on the mold 7 produced during the step S109 (step S109). The adjustment (wafer alignment) is particularly effective when the relative position of the mold 7 and the wafer 11 deviates from the position in the step S105 in the X-Y axis direction in the step S108. Step S109 may be continuously executed during the processing in the step S106 to the step S108. Next, the controller 6 irradiates UV light 8 from the light irradiation unit 2 on the resin 14 pressed the mold 7 and thereby cures the resin 14 (curing step: step S110). Then, the controller 6 separates the mold 7 (pattern portion 7a) from the resin 14 on the wafer 11 by use of the mold drive mechanism 16 (mold release step: step S111). Then, the controller 6 determines whether or not there is a resulting shot that forms a pattern on the wafer 11 (step S112). When it is determined that there is a new shot, the process proceeds to step S103. Next, when it is determined that there is not a new shot in the step S112, the controller 6 uses the substrate conveying mechanism to recover the wafer 11 from the wafer chuck 19 (step S113). Next, the controller 6 determines whether or not there is a wafer 11 which is the object of the subsequent processing operation (step S114), and when it is determined that there is a new wafer 11, the processing proceeds to step S102. Then, when the controller 6 determines that there is a not a new wafer 11 in the step S114, the mold conveying mechanism recovers the mold 7 from the mold chuck 15 (step S115), and the operating sequence is finished.

In this manner, the extrusion step in step S108 or the curing step in step S110 in the imprint apparatus 1 applies a suitable bending to the mold 7 by use of the actuator 33 separately to the magnification correction performed by the magnification correction mechanism 18. Therefore, as described above, stress concentration on a part of the pattern portion 7a, in particular produced on the outermost peripheral portion, is suppressed, and therefore an effect on the overlay accuracy or on the linearity of the pattern pitch can be suppressed. Furthermore, the configuration of the mold chuck 15 as described above interposes a connecting portion 32 using a plate spring to thereby enable an independent configuration for the base portion 30 connected to the mold drive mechanism 16 and the holding portion 31 that holds and deforms the mold 7. Therefore, even when the holding portion 31 is deformed, the mold chuck 15 is firmly supported by the mold drive mechanism 16. Furthermore, the configuration of the mold chuck 15 is also advantageous in avoiding an increase in the size of the overall shape of the mold holding mechanism 3 including the mold chuck 15 since there is no requirement for a special feature such as the configuration or position of installation of the magnification correction mechanism 18.

In this manner, the present embodiment provides an imprint apparatus 1 that is useful for improvement in the overlay accuracy of the mold 7 and the resin 14 on the wafer 11.

Second Embodiment

Next, the imprint apparatus according to a second embodiment of the present invention will be described. The characteristic feature of the imprint apparatus according to a second embodiment is the variation of the configuration of the mold chuck 15 of the first embodiment. FIG. 5A and FIG. 5B are schematic views illustrating the configuration of the mold chuck 40 according to the second embodiment. In particular, FIG. 5A is a plan view seen from the direction of irradiation of UV light 8, and FIG. 5B is a sectional view along the line B-B' corresponding to the line B-B' in FIG. 5A. The same reference numerals have been used to denote the same features of configuration as the imprint apparatus 1 according to the first embodiment and description will not be repeated. The mold chuck 40 is a tabular member having an rectangular outer shape, and includes a base portion 42 and a holding portion 43 that are disposed to be mutually overlapping through four connecting portions 41 in the direction of irradiation of UV light 8 (the Z axis direction). The base portion 42 includes an open region 44 in the center portion of the XY plane (corresponding to the open region 17 of the mold chuck 15), and the surface on the side irradiated with UV light 8 is connected to the mold drive mechanism 16. The holding portion 43 holds the mold 7, and has a surface area that is larger than the mold 7. Furthermore, the holding portion 43 includes an open region (not shown) in the center portion of the XY plane in the same manner as the base portion 42, and although not illustrated, includes a suction portion that draws the outer edges of the mold 7 positioned on the outer periphery of the open region on the surface facing the wafer 11. The connecting portion 41 for example is disposed on the four corners of the surface facing the holding portion 43 of the base portion 42, and includes flexible characteristics respectively in the omega x direction and the omega y direction. In particular, the connecting portion 41 of the present embodiment includes a plate spring 41a that has a thin configuration in the X axis direction and supports the holding portion 43 flexibly in the omega y direction and a plate spring 41b that has a thin configuration in the Y axis direction and supports the holding portion 43 flexibly in the omega x direction. The mold chuck 40 includes four actuators 45 (45a-45d) between the base portion 42 and the holding portion 43. As illustrated in FIG. 5A, these actuators 45 are disposed on the periphery of the open region 44, and between two respective connecting portions 43. The actuator 45a disposed in the Y axis direction illustrated in FIG. 5B as an example of the actuators 45 includes a drive unit 46 in which the driving direction (stroke direction) is the Z axis direction and a flexible member 47. One end of the drive unit 46 is fixed to the base portion 42, and the other end is fixed to the holding portion 43 through a flexible member 47.

The present embodiment enables the same effect as the first embodiment since the flexible connecting portion 41 also operates by compression of the actuator 45, the holding portion 43 is deformed in the omega x direction and the omega y direction, and the mold 7 is suitably deformed as a result of this deformation. In particular, the actuator 45 in the configuration in the present embodiment drives in the Z axis direction, and therefore is effective when adopting an actuator that has a relatively small developed force and that has a small stroke.

(Article Manufacturing Method)

A method for manufacturing a device (semiconductor integrated circuit element, liquid display element, or the like) as an article may include a step of forming a pattern on a substrate (wafer, glass plate, film-like substrate, or the like) using the imprint apparatus described above. Furthermore, the manufacturing method may include a step of etching the substrate on which a pattern has been formed. When other article such as a patterned medium (storage medium), an optical element, or the like is manufactured, the manufacturing method may include other step of processing the substrate on which a pattern has been formed instead of the etching step. The article manufacturing method of the present embodiment has an advantage, as compared with a conventional article manufacturing method, in at least one of performance, quality, productivity and production cost of an article. While the embodiments of the present invention have been described with reference to embodiments, it is to be understood that the invention is not limited to the disclosed embodiments. The scope of the following claims is to be accorded the broadest interpretation so as to encompass all such modifications and equivalent structures and functions.

This application claims the benefit of Japanese Patent Application No. 2011-175722 filed Aug. 11, 2011 which is hereby incorporated by reference herein it its entirety.

The invention claimed is:

1. An imprint apparatus configured to form a pattern of an imprint material on a substrate using a mold, the imprint apparatus comprising:
a first drive mechanism configured to apply a force to the mold in a direction that is orthogonal to a direction of pressing the mold to the imprint material, to change a shape of a pattern area formed in a surface of the mold;
a second drive mechanism configured to deform the mold;
a mold drive mechanism configured to displace the mold in the direction of pressing the mold to the imprint material; and
a mold holding unit including:
a holding portion configured to hold the mold; and
a base portion configured to support the holding portion through a flexible connecting portion and be held by the mold drive mechanism,
wherein the second drive mechanism deforms the holding portion so as to bend the mold around an axis that is orthogonal to the direction of pressing the mold to the imprint material and the direction of the force applied to the mold by the first drive mechanism.

2. The imprint apparatus according to claim 1, wherein a plurality of second drive mechanisms:
are disposed on the holding portion to respectively correspond to two directions that are orthogonal to the direction of pressing the mold to the imprint material; and
apply a force to the holding portion to deform the holding portion into a shape that is symmetrical with reference to an axis that passes through the center of the mold in the two directions.

3. The imprint apparatus according to claim 2, wherein:
the holding portion is positioned on an inner side in the direction of the force applied by the first drive mechanism relative to the base portion,
the second drive mechanism is disposed through a fixing member that fix both ends of the second drive mechanism in a driving direction respectively to the holding portion, and
the driving direction is orthogonal to the direction of pressing the mold to the imprint material.

4. The imprint apparatus according to claim 2, wherein:
the holding portion is positioned on a side facing the substrate in the direction of pressing mold to the imprint material relative to the base portion, and
one end of the second drive mechanism in the driving direction is connected to the base portion, and the other end of the second drive mechanism is connected to the holding portion, and
the driving direction is parallel to the direction of pressing the mold to the imprint material.

5. The imprint apparatus according to claim 1, wherein:
the flexible connecting portion comprises a plate spring having flexible characteristics with respect to the direction of deformation of the holding portion.

6. The imprint apparatus according to claim 1, further comprising:
a measuring device configured to measure a deformation amount of the holding portion; and
a controller configured to control a drive amount of the second drive mechanism so that the deformation amount is a predetermined bending amount with respect to the holding portion.

7. The imprint apparatus according to claim 6, wherein:
the controller determines the bending amount based on a relative position of the pattern area formed in a surface of the mold and a pattern preformed on the substrate.

8. The imprint apparatus according to claim 6, wherein:
the controller determines the bending amount based on a deformation shape of the pattern area produced by driving of the first drive mechanism.

9. The imprint apparatus according to claim 6, wherein:
the measuring device comprises a distortion sensor configured to measure distortion produced in the holding portion, or a position sensor configured to measure displacement of the holding portion or the mold.

10. The imprint apparatus according to claim 1, wherein:
a rotational moment about the axis, which is applied to the mold holding unit by the second drive mechanism, is determined based on a deformation amount of the pattern area where the shape is changed by applying the force to the mold by the first drive mechanism.

* * * * *